United States Patent
Hsu et al.

[11] Patent Number: 5,861,634
[45] Date of Patent: Jan. 19, 1999

[54] CHARGE COLLECTOR STRUCTURE FOR DETECTING RADIATION INDUCED CHARGE DURING INTEGRATED CIRCUIT PROCESSING

[75] Inventors: Ching-Hsiang Hsu, Hsin-Chu; Chrong-Jung Lin, Taipei; Mong-Song Liang, Hsin-Chu, all of Taiwan

[73] Assignee: Taiwan Semiconductor Manufacturing Company, Ltd., Hsin-Chu, Taiwan

[21] Appl. No.: 871,504

[22] Filed: Jun. 9, 1997

[51] Int. Cl.[6] ............................................. H01L 23/58
[52] U.S. Cl. ..................... 257/48; 257/291; 257/300; 257/428; 324/769
[58] Field of Search ........................... 257/48, 291, 300, 257/428, 429, 430; 324/765, 769

[56] References Cited

U.S. PATENT DOCUMENTS

| | | | |
|---|---|---|---|
| 4,196,389 | 4/1980 | Kelly et al. | 324/158 |
| 5,315,145 | 5/1994 | Lukaszek | 257/379 |
| 5,396,169 | 3/1995 | Buehler et al. | 324/158.1 |
| 5,693,947 | 12/1997 | Morton | 250/370.09 |
| 5,777,728 | 7/1998 | Schiller | 356/222 |

*Primary Examiner*—Sara Crane
*Attorney, Agent, or Firm*—George O. Saile; Stephen B. Ackerman; Bill Knowles

[57] ABSTRACT

A method and structure for the evaluation of the density of charge induced to a semiconductor substrate during exposure to radiation as a result of integrated circuits processing procedures such as ion implantation and plasma etching is disclosed. A plurality of stacked gate field effect transistors, wherein each stacked has a charge collection capacitor attached to the gate, is fabricated on a semiconductor substrate. Each charge collection capacitor has an area that is different from every other charge collection capacitor. The to substrate is exposed to a radiation source. The threshold voltage for each of the stacked gate field effect transistors is measured. The difference in threshold voltage for the stacked gate transistors is proportional to the amount of charge induced during the exposure to the radiation and the density of the charge induced by the exposure to the radiation can be calculated from the comparison of the threshold voltage and the area of the charge collection capacitors.

19 Claims, 8 Drawing Sheets

CHARGE COLLECTOR STRUCTURE FOR DETECTING RADIATION INDUCED CHARGE DURING INTEGRATED CIRCUIT PROCESSING

BACKGROUND OF THE INVENTION

1. Field of the Invention

This Invention relates to structures and methods necessary to evaluate the effects of variations in process parameters during the fabrication of integrated circuits upon a semiconductor substrate and more particularly to structure and method to determine the density of charge induced by radiation during such processes as ion implantation and plasma etching, to evaluate subsequent damage to the semiconductor substrate from the radiation induced charge.

2. Description of Related Art

During the fabrication of integrated circuits the surface of semiconductor substrates are exposed to sources of high energy radiation. An example of such a source is ion implantation, where high concentrations of elemental materials such as boron are forced to diffuse into the surface of the semiconductor substrate. Another example is plasma etching, where material is removed from the surface of the semiconductor substrate by the action of a high energy plasma eroding the surface of the semiconductor substrate.

In each of these examples, electrical charges can accumulate at the interface between a conductive material such as a metal and an insulator such as silicon dioxide. If the magnitude of the charge is sufficiently large the insulator may be damaged.

Referring to FIG. 1a, a semiconductor substrate 10 has a well 12 of a first conductivity type such a p-type material diffused into the surface of the semiconductor substrate 10. A drain region 14 and a source region 16 is diffused into the well 12 in the surface of the semiconductor substrate 10. Metal is deposited upon the surface of the semiconductor substrate 10 to form a drain contact 18 and source contact 20. A thin gate oxide 22 is grown between the drain region 14 and the source region 16. A field oxide 24 is grown on the surface of the semiconductor substrate 10 in the area outside the drain region 14 the source region 16, and the thin gate oxide 22. A polysilicon gate contact 28 is opened in the field oxide 24.

This structure is a thin oxide field effect transistor (FET) and is constructed by processing that is well known and practiced in the art.

To evaluate the charge effects of radiation during the semiconductor processing, a relatively large area of metal 26 is formed on the semiconductor substrate and connected to the gate 28 of the FET. The meal area 26 acts as the top plate of a charge collection capacitor with the field oxide 24 being the insulator and the semiconductor substrate 10 being the bottom plate. The capacitance of this structure is directly proportion to the area of the top plate metal 26.

FIG. 1b is a view of the cross section of FIG. 1a at line 1b–1b'. If this structure is exposed to a radiation source 30, electrical charges 32 will collect at the surface interface between the metal layer 26 and 28 and the field oxide 24 and the thin gate oxide 22. As is shown in FIG. 1c, which is a cross section of FIG. 1a along the line 1c–1c', the induced charges 32 will create an electrical field 34 within the thin gate oxide 34 sufficiently large as to damage the thin gate oxide 34.

The magnitude of this voltage $V_b$ can be calculated as:

$$V_b = \frac{Q_{collect}}{C_1 + C_2}$$

where $V_b$ is the magnitude of the voltage at the gate 34;

$Q_{collect}$ is the magnitude of the charge 32;

$C_1$ is the magnitude of the thin oxide capacitance between the gate metal 28 and the well 12 within the substrate 10; and $C_2$ is the magnitude of the charge collection capacitor 26.

FIG. 2 shows a schematic of the equivalent circuit for the device of FIG. 1a. While an estimate of the charge $Q_c$ maybe made, there is no retention of the charge $Q_c$ once the radiation producing processing step is completed. The charge $Q_c$ will be dissipated during the handling and further processing of the semiconductor substrate.

Traditional methods for evaluation of radiation induced charge damage to a semiconductor substrate have required the cross-sectioning of the semiconductor substrate and examining the cross-sectioned surface in the area of the thin gate oxide 22 of FIG. 1a and the field oxide 24 of FIG. 1a. The level of damage is an indicator of the level of the charge induced during the processing step, but can not provide any direct measurement of the charge density and consequent field strength U.S. Pat. No. 5,396,169 (Buehler, et al.) describes a method for predicting the single event upset susceptibility of a static random access memory to alpha particle radiation.

U.S. Pat. No. 4,196,389 (Kelly, et al.) discloses a test site structure to evaluate the minimum distances between adjacent channels of charge coupled device. The test site will allow measurement of charge transfer efficiency and charge leakage between channels.

SUMMARY OF THE INVENTION

An object of this invention is to create a method to determine the density of electrical charge induced to the surface of a semiconductor substrate during exposure to a radiation source from such integrated circuits fabrication processes as ion implantation and plasma etching. Another object of this invention is the creation of a structure on the surface of the semiconductor substrate to accumulate and retain the electrical charges induced during exposure to the radiation source.

To accomplish these and other objects, a method to measure the density of a charge induced by radiation has a plurality of stacked gate field effect transistors fabricated on the surface of a semiconductor substrate. Each stacked gate field effect transistor has a drain, a source, a floating gate and gate. A plurality of charge collection capacitors are formed on the surface of the semiconductor substrate. Each charge collection capacitor is connected to the gate of each stacked gate field effect transistor. Each charge collection capacitor has an area that differs from the area of the other charge collection capacitors of the plurality of charge collection capacitors.

The plurality of stacked gate field effect transistors and the plurality of charge collection capacitors are exposed to the radiation. The gate, drain and source of each of the stacked gate field effect transistors are contacted with an apparatus to measure the threshold voltage of each of the stacked gate field effect transistors.

The threshold voltage of each of the stacked gate field effect transistors is compared to the area of the charge collection capacitor connected to the gate of the stacked gate field effect transistor.

The change in threshold voltage over the plurality of stacked gate field effect transistors versus the change in the area of the charge collection capacitors is determined. This change in threshold voltage versus the change in area of the charge collection capacitors is the density of the charge collected on the charge collection capacitors per unit area.

The method to measure the density of induced charge density may be repeated with variations of the process parameters that affect the magnitude of the radiation.

BRIEF DESCRIPTION OF THE DRAWINGS

FIG. 2 is schematic diagram of the equivalent circuit of the gate of the field effect transistor and the charge collection capacitor of the prior art of FIG. 1a.

FIG. 4 is a schematic diagram of the equivalent circuit of the gate of the stacked gate field effect transistor and the charge collection capacitor of FIG. 3a.

DETAILED DESCRIPTION OF THE INVENTION

Figure 1A:
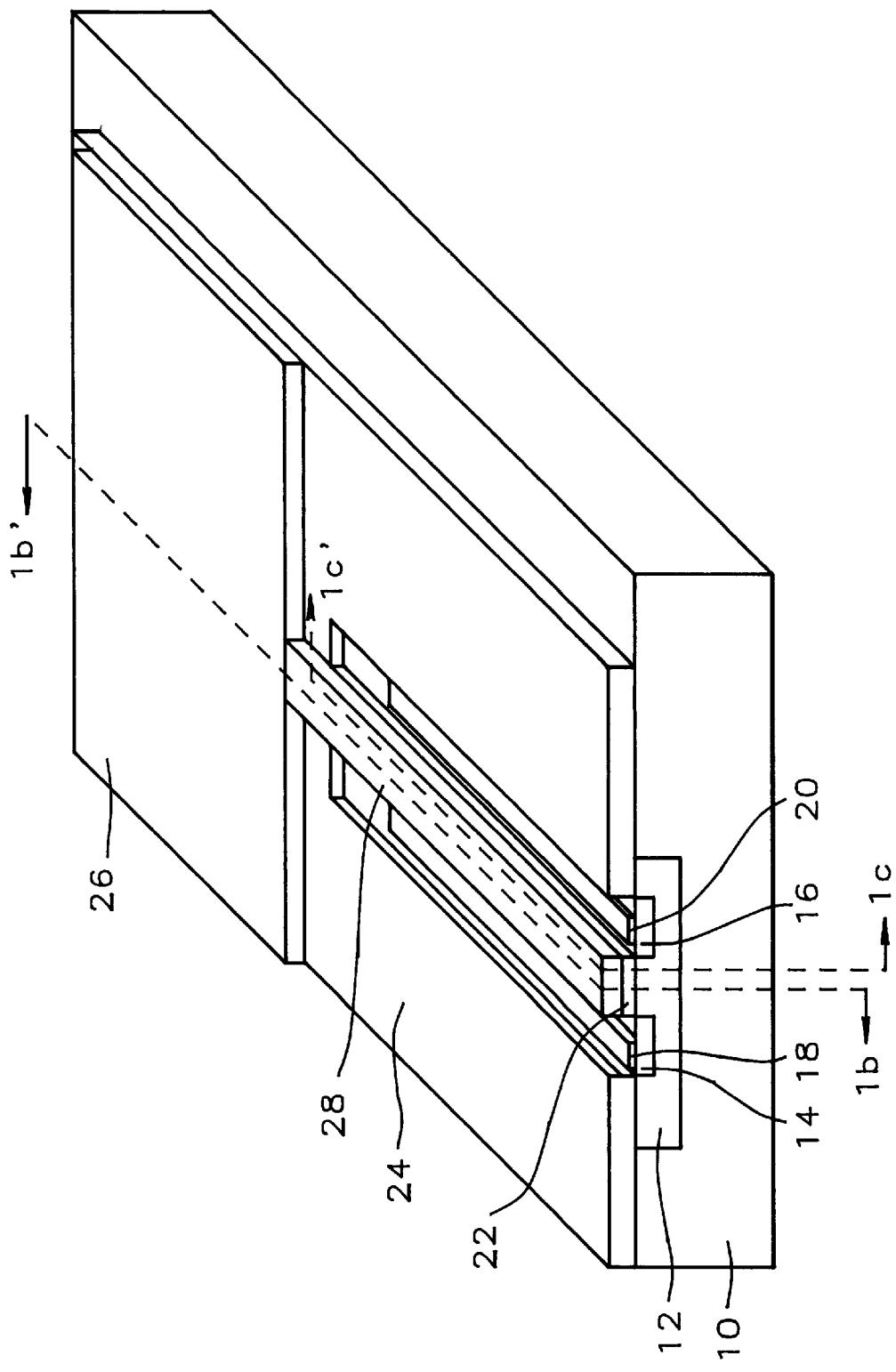
FIG. 1a is a diagram of a field effect transistor of the prior art with a charge collection capacitor connected to the gate of the field effect transistor.
Figure 1B:
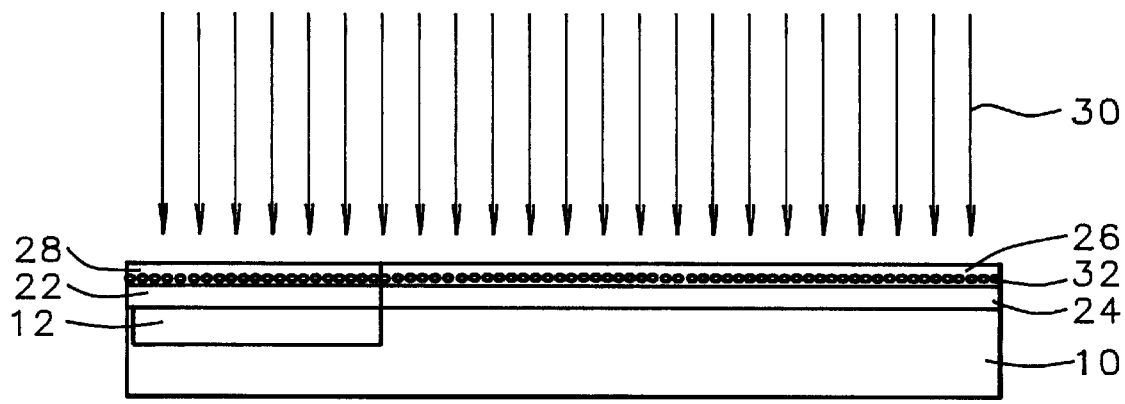
FIG. 1b is a section view of FIG. 1a along line 1b–1b', showing the collection of charge under exposure to radiation of the prior art.
Figure 1C:
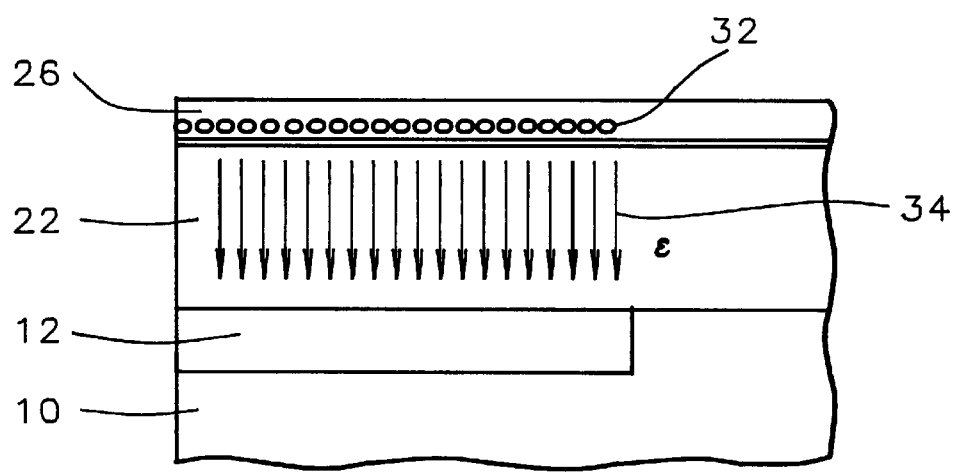
FIG. 1c is a section view of the FIG. 1a along line 1c–1c', showing the electrical field within the field effect transistor created by the induced charge of the prior art.
Figure 2:
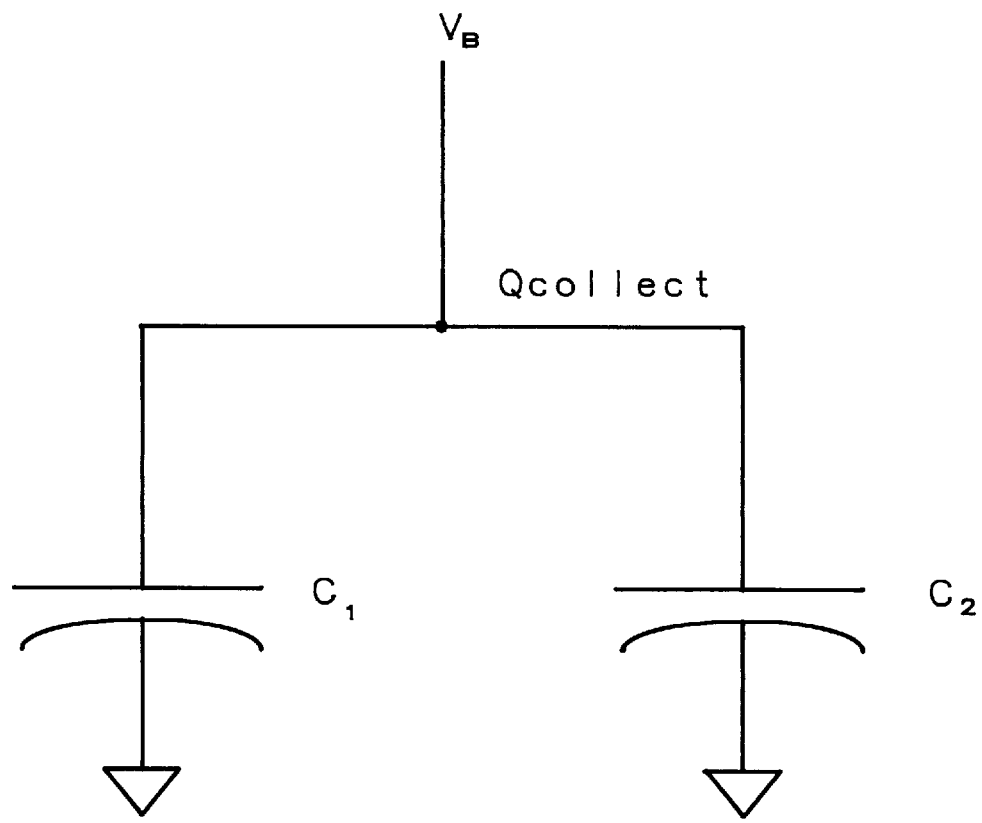
Figure 3A:
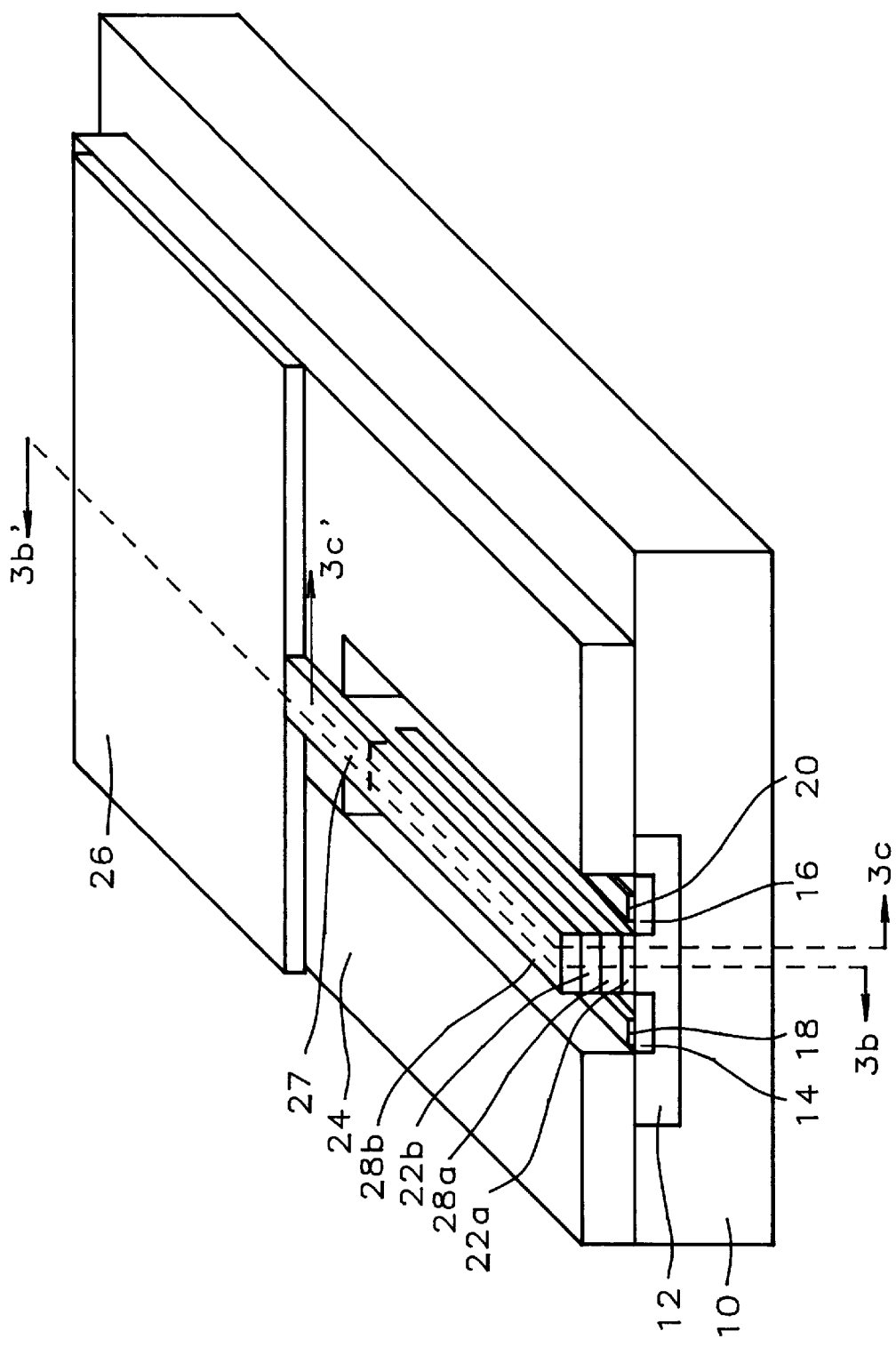
FIG. 3a is a diagram of a stacked gate field effect transistor with a charge collection capacitor connected to the gate of the field effect transistor of this invention.

A test structure that has a stacked gate FET and a charge collection capacitor to measure the density of charge that is induced to the surface of a semiconductor substrate as a result of radiation is shown in FIG. 3a. The FET is formed on a semiconductor substrate 10 into which a well of a first conductivity type such a p-type material is diffused. A drain region 14 and a source region 16 of a second conductivity type such as an n-type material is diffused into the well 12 of the semiconductor substrate 10. Metal is deposited on the surface of the semiconductor substrate 10 in the drain region 14 to form the drain contact 18 and the source region 16 to form the source contact 20. A thin oxide insulator is grown on the surface of the semiconductor substrate 10 between the drain region 14 and the source region 16 to form a thin gate oxide 22a. An field oxide insulator 24 is grown in the area of the semiconductor substrate 10 external to the region of the FET defined by the drain region 14 and the source region 16.

A conductive layer 28a of a material such as polycrystalline silicon is deposited on the thin gate oxide 22a to form a floating gate. This conductive layer 28a is said to be floating in that it is not attached to any external circuitry. A second thin oxide insulator is grown upon the floating gate 28a to form a second thin gate oxide 22b. A second conductive material such as aluminum or polysilicon is deposited on the second thin gate oxide 22b to form the gate 28b of the FET.

The top plate of a charge collection capacitor 26 is formed by the deposition of the conductive material upon the surface of the field oxide 24. The charge collection capacitor is formed by the top plate 26, the field oxide 24, and the semiconductor substrate 10.

The top plate of the charge collection capacitor 26 is connected to the gate 28b of the FET by the metal or polysilicon connection 27.

Figure 3B:
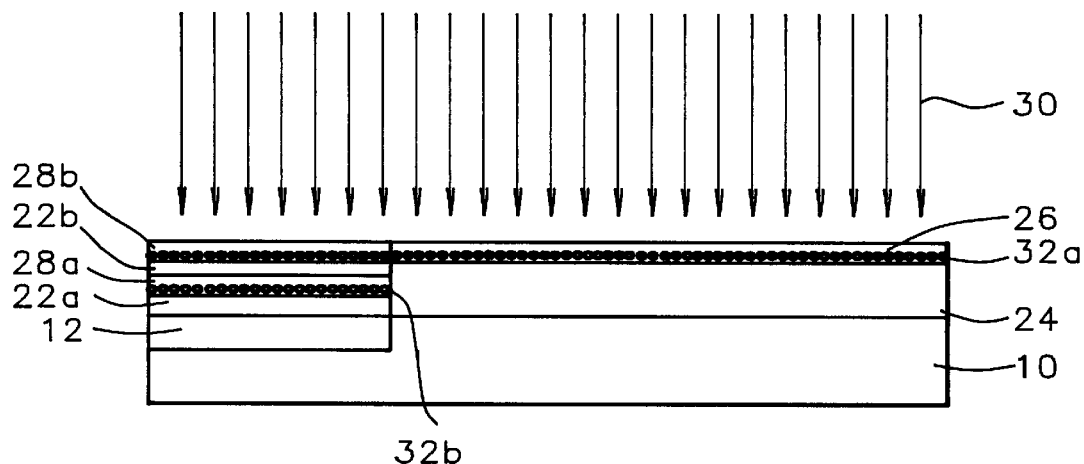
FIG. 3b is section view of the FIG. 3a along line 3b–3b', showing the collection of charge under the exposure to radiation of this invention.

FIG. 3b, a section diagram of FIG. 3a along line 3a–3a', shows the semiconductor substrate 10 exposed to radiation 30. Electrical charge 32a and 32b is induced to the conductive material of the floating gate 28a, the gate 28b, and the top plate of the charge collection capacitor 26. As the induced positive charges 30a in the floating gate increase 28a, electrical field in the thin gate oxide 22a and 22b increases and results in the tunneling of electrons from the substrate 10 into the floating gate 28a. The charges 30a will collect at the interface of the top plate of the charge collection capacitor 26 and the field oxide 24 and the gate 28b and the thin gate oxide 28b and the charges 30b will collect at the interface of the floating gate 28a and the thin gate oxide 22a.

Figure 3C:
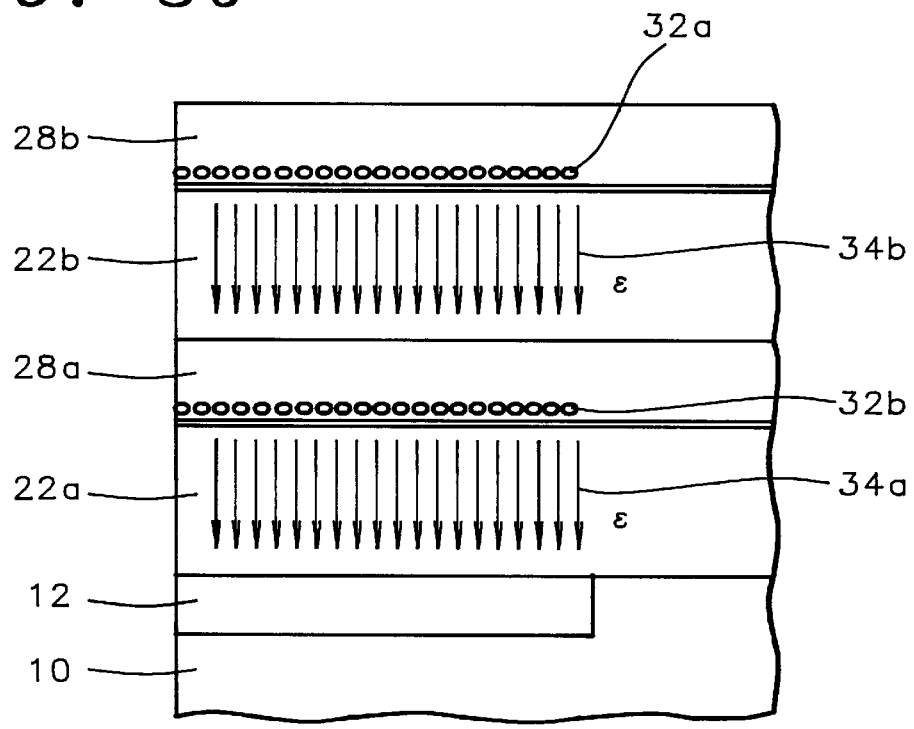
FIG. 3c is a section view of the FIG. 3a along line 3c–3c', showing the electrical field within the stacked gate field effect transistor of this invention.

The section diagram of FIG. 3a, shown in FIG. 3c, illustrates the electric fields 34a and 34b that are present as a result of the induced electrical charges 30a and 30b. These electrical fields 34a and 34b may be of sufficient magnitude as to cause damage to the thin gate oxides 22a and 22b.

After the removal of the source of radiation, the charge induced at the top plate of the charge collection capacitor will dissipate during the handling of the semiconductor substrate, thus making measurement of the charge density impossible. However, the electrons in the floating gate 28a will remain.

The threshold voltage of the stacked gate FET of FIG. 3a is proportional to the magnitude of the charge in the floating gate.

Figure 4:
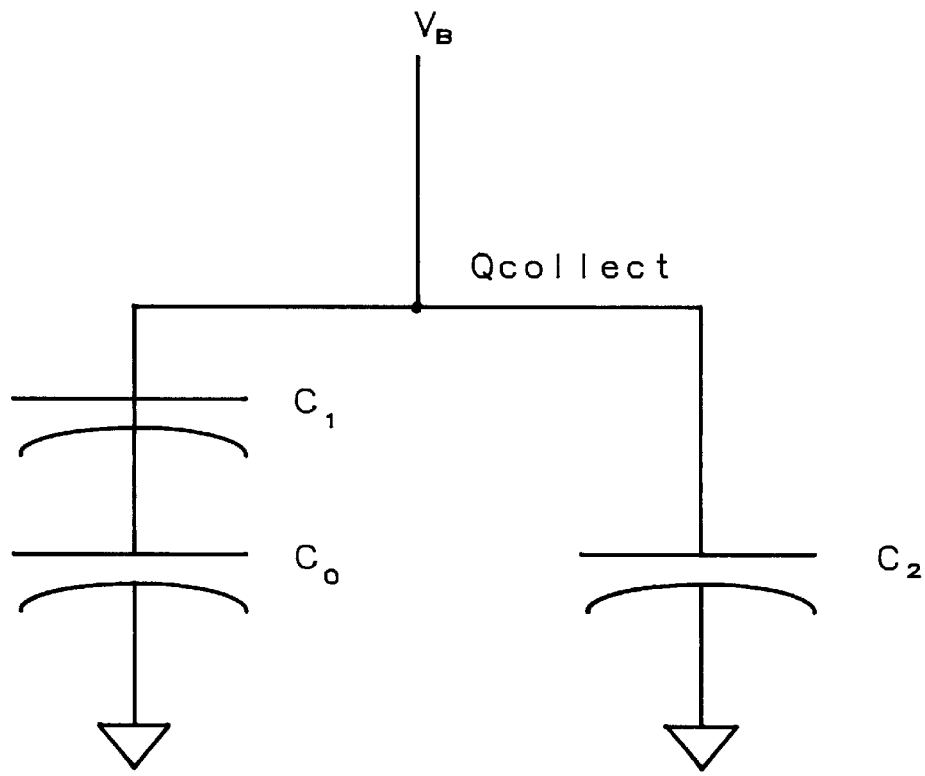

FIG. 4 shows a schematic of the capacitances of the stacked floating gate $C_0$, the gate $C_1$ of the FET connected to the charge collection capacitor $C_2$. The voltage developed as a result of the induced charge on the floating gate capacitance $C_0$ is maintained even though the charge on the gate capacitor $C_1$ and the charge collection capacitor $C_2$ has been dissipated. This level of voltage on the floating gate capacitor $C_0$ will cause the shift in the level of the threshold voltage of the FET.

If a plurality of these test structures as described in FIG. 3a are placed on a semiconductor substrate, and if each of the charge collection capacitors has a different area, then the variation in shift of the threshold voltage over the plurality of test structure will indicate the magnitude of the charge density induced by the radiation The change in threshold voltage for the individual test structure can be expressed as:

$$\Delta V_{th} = \frac{Q_{collect}}{\frac{C_0 C_1}{C_0 + C_1} + C_2} = \frac{Q_a A_{collect}}{\frac{C_0 C_1}{C_0 + C_1} + C_2}$$

where $\Delta V_{th}$ is the change in threshold voltage due to the charge present on the floating gate.

$Q_{collect}$ is the charge collected on the charge collection capacitor and the gate of the stacked gate FET.

$C_0$ is the capacitance of the floating gate of the stacked gate FET.

$C_1$ is the capacitance of the gate of the stacked gate FET.

$C_2$ is the capacitance of the charge collection capacitor.

$A_{collect}$ is the area of the top plate of the charge collection capacitor.

Figure 5:
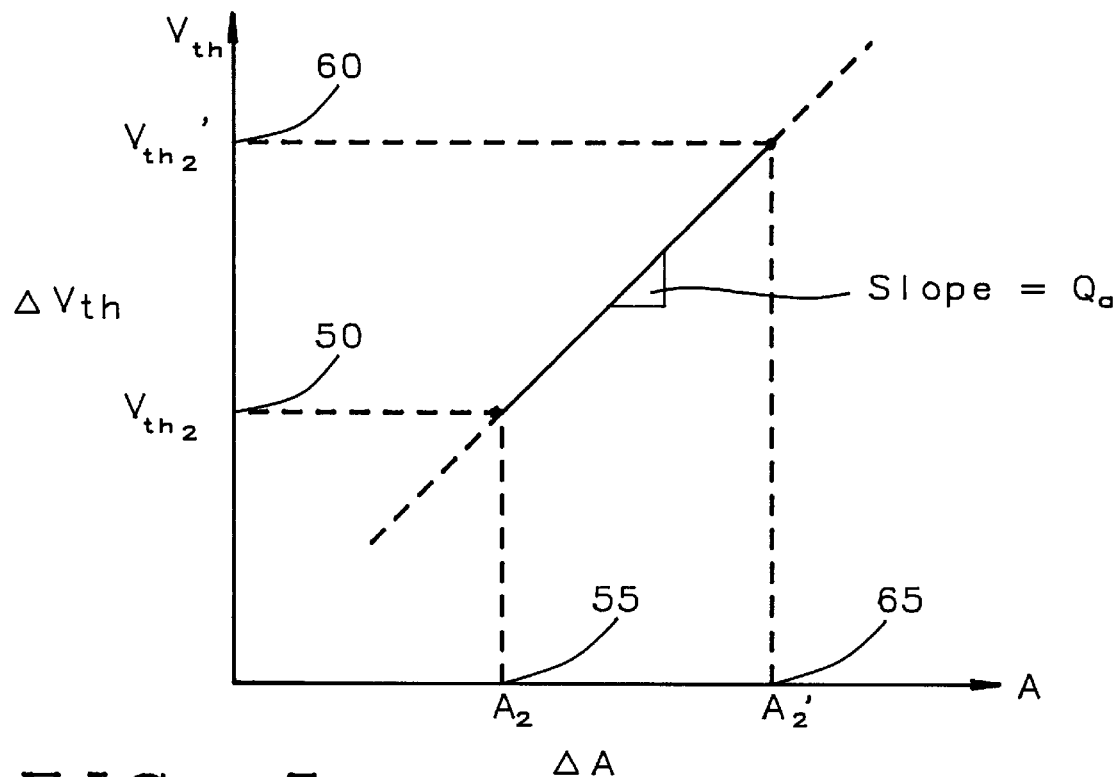
FIG. 5 is a graphical diagram of the threshold voltages of the plurality of stacked gate field effect transistors versus the area of each of the charge collection capacitor to illustrate the determination of the charge density.

FIG. 5 illustrates a plot of the changes in threshold voltage $\Delta V_{th}$ versus the area of the charge collection capacitors for the plurality of test structures. The change in threshold voltage $\Delta V_{th}$ from the first test structure 50 and the second test structure 60 is compared to the difference in area $\Delta A$ of the first charge collection capacitor 55 with the second charge collection capacitor 65 to provide the charge density. That is $$Q_a = \frac{V_{th2}' - V_{th2}}{A_2' - A_2}$$

Figure 6:
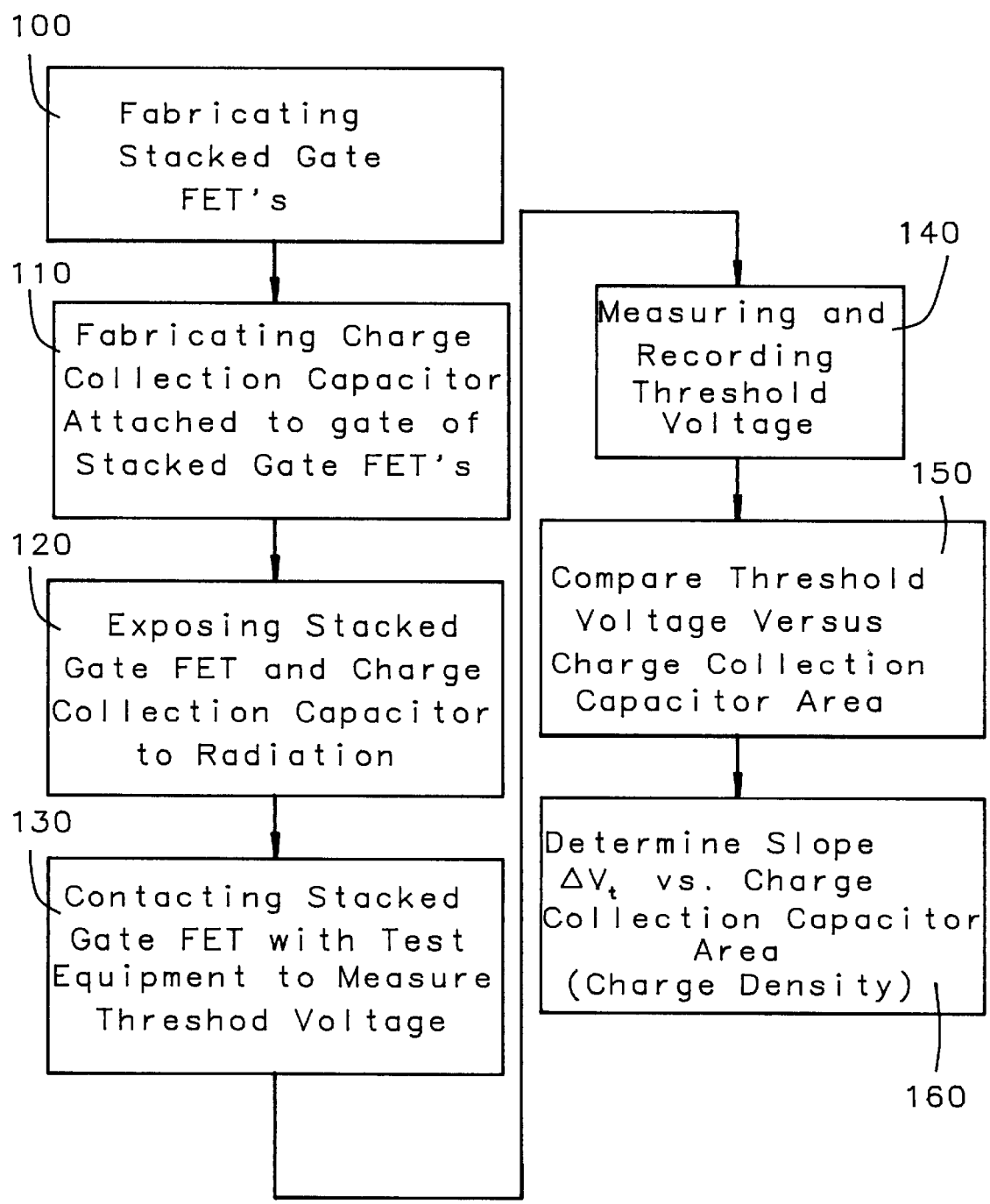
FIG. 6 is a flow chart of the method for the determination of the charge density induced during exposure to radiation of a semiconductor substrate.

Referring to FIG. 6, the method to evaluate the density of charge induced by radiation during integrated circuits processing has the steps of:

1. Fabricating a plurality of stacked gate FET's 100 and charge collection capacitors 110 attached to the stacked gate FET's on a semiconductor substrate.

2. Exposing 120 the semiconductor substrate containing the stacked gate FET's with attached charge collection capacitors to radiation such as that encountered during ion implantation and plasma etching during the integrated circuits fabrication process.

3. Contacting 130 the stacked gate FET with test equipment, measuring and recording 140 the threshold voltage of each stacked gate FET.

4. Comparing 150 the measured threshold voltage for the stacked gate FET to the area of the attached charge collection capacitor for each of the plurality of stacked gate FET's on the semiconductor substrate.

5. Determining 160 from the differences in the threshold voltage of the stacked gate FET's and the differences in the areas of the charge collection capacitors the density of the induced charge form the radiation.

Figure 7:
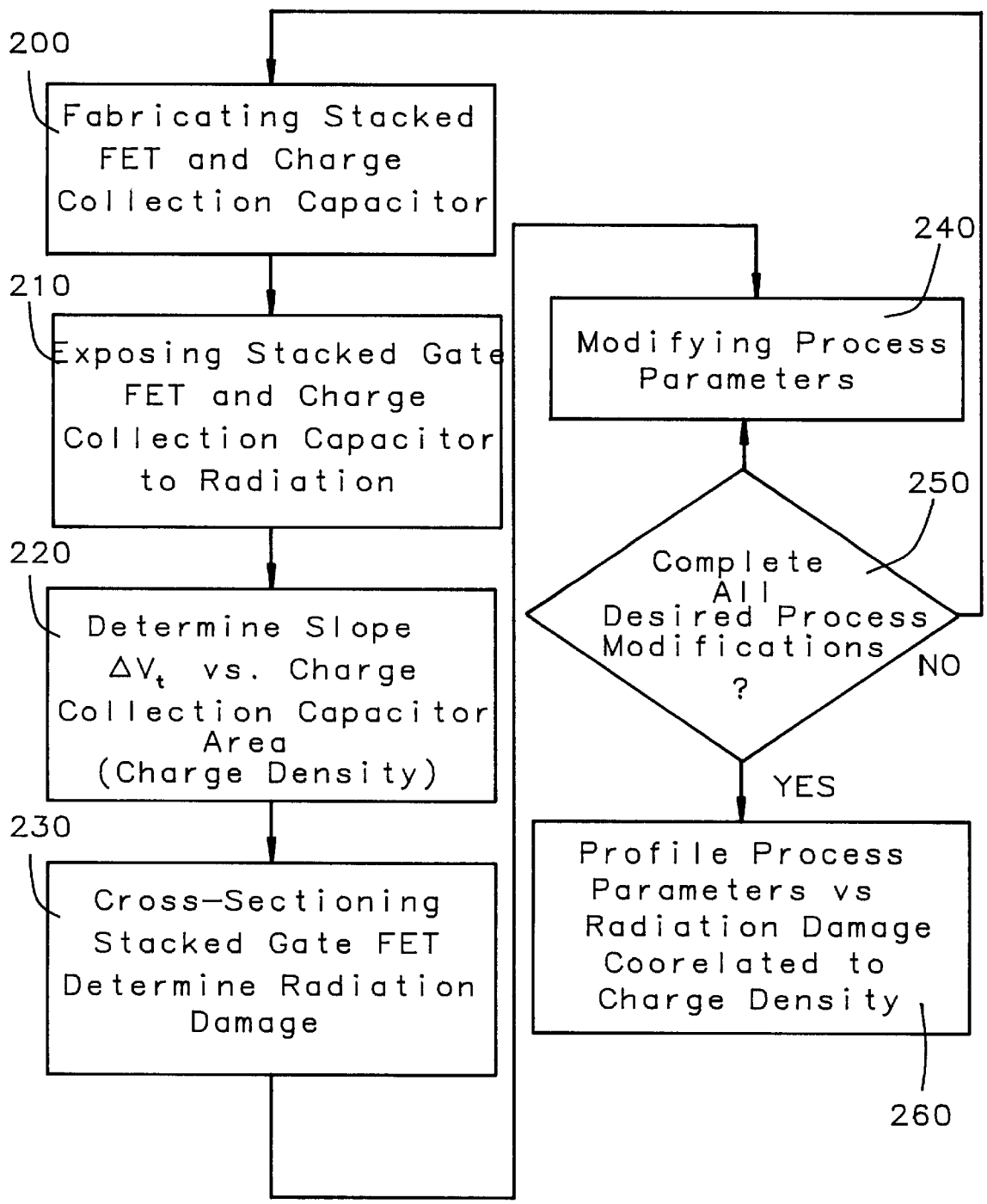
FIG. 7 is flow chart of the method to profile variations of process parameters effecting charge inducting radiation during the integrated circuit fabrication process.

Now, referring to FIG. 7, the method described in FIG. 6 can be extended to provide a profile that relates the density of the induced charge to the level of damage to the semiconductor substrate for variation in the parameters of the radiation producing process. This profile will allow calibration and monitoring of the integrated circuit fabrication process.

A plurality of stacked gate FET's and attached charge collection capacitors with multiple areas are fabricated 200 on a semiconductor substrate. The stacked gate FET's with the attached charge collection capacitors are exposed 210 to the radiation source of the integrated circuits process. The density of the induced charge is determined 220.

The semiconductor substrate is then cross-sectioned 230 and examined via a transmission electron microscope (TEM) to determine any serious damage due to excess charge due to the radiation. Only the most severe damage may be visible under the TEM. The process parameters are modified 240 and the processing is repeated 250 until sufficient information about the density of the radiation induced charge and the amount of damage to the semiconductor substrate is gathered as the process parameters are varied. The semiconductor process is then profiled 260 to compare the process parameters to the density of the charge induced by the radiation and the level of damage produced by the charge.

While this invention has been particularly shown and described with reference to the preferred embodiments thereof, it will be understood by those skilled in the art that various changes in form and details may be made without departing from the spirit and scope of the invention.

What is claimed is:

1. A method to measure a density of an electrical charge per unit area induced to a semiconductor substrate by a radiation having a magnitude comprising the steps of:
    a) fabricating a plurality of stacked gate field effect transistors each having a drain, a source, a floating gate to accumulate and retain said electrical charge, and a gate;
    b) fabricating a plurality of charge collection capacitors wherein each charge collection capacitor is connected to the gate of one of said plurality of stacked gate field effect transistors and wherein each charge collection capacitor has an area that is unequal to the area of any of the other charge collection capacitors of the plurality of charge collection capacitors;
    c) exposing said plurality of stacked gate field effect transistors and the plurality of charge collection capacitors to the radiation;
    d) contacting each stacked gate field effect transistor with a threshold voltage measuring apparatus;
    e) measuring and recording a threshold voltage parameter for each of the stacked gate field effect transistors;
    f) comparing said threshold voltage parameter of each stacked gate field effect transistor with the area of each charge collection capacitor attached to said stacked gate field effect transistor;
    g) determining a change in the threshold voltage parameter between each of the plurality of stacked gate field effect transistors versus the change in area for each of the charge collection capacitors attached to the stacked gate field effect transistors, which is the density of said electrical charge induced per unit area of exposure to said radiation.

2. The method of claim 1 further comprising the steps of:
    a) examining said semiconductor substrate to identify any damage to said semiconductor substrate as a result of said electrical charge;
    b) modifying the magnitude of radiation; and
    c) repeating said method to measure said density of said electrical charge to establish a profile of said modifying of fabrication parameters versus amount of damage to said semiconductor substrate as a result of said electrical charge induced by said radiation.

3. The method of claim 1 wherein the radiation is produced by a member of a set of integrated circuit processing procedures that include ion implantation and plasma etching, and the magnitude of said radiation is a factor of the parameters of said integrated circuits processing procedures.

4. The method of claim 1 wherein the threshold voltage parameter is inversely proportional to a value of said charge collection capacitor connected in parallel with a series connection of a capacitance of the gate and a capacitance of the floating gate.

5. The method of claim 1 wherein the threshold voltage parameter is directly proportional to a charge collected on the floating gate of said stacked gate field effect transistor.

6. A radiation charge collection test structure to accumulate and retain an electrical charge when said test structure is exposed to a radiation source to allow the determination of a charge density per unit area from said electrical charge, comprising:
   a) a plurality of stacked gate field effect transistors, wherein each stacked gate field effect transistor has a drain, a source, a floating gate to accumulate and retain said electrical charge, and a gate; and
   b) a plurality of charge collection capacitors, wherein each charge collection capacitor is connected to the gate of each of the stacked gate field effect transistor and wherein each charge collection capacitor has an area that is not equal to the area of any other of the charge collection capacitors of said plurality of charge collection capacitors.

7. The test structure of claim 6 wherein each stacked gate field effect transistor exposed to said radiation, contacted with a threshold voltage measuring apparatus to measure and record a threshold voltage parameter for each of the stacked gate field effect transistors of the plurality of stacked gate field effect transistors.

8. The test structure of claim 7 wherein the threshold voltage parameter of each stacked gate field effect transistor is compared with the area of each charge collection capacitor attached to said stacked gate field effect transistor.

9. The test structure of claim 8 wherein a change in the threshold voltage parameter between each of the plurality of stacked gate field effect transistors versus the change in area for each of the charge collection capacitors attached to the stacked gate field effect transistors is determined, which is the density of said electrical charge induced per unit area of exposure to said radiation.

10. The test structure of claim 6 wherein said test structure is cross-sectioned and examined to identify any damage to said test structure as a result of said electrical charge.

11. The test structure of claim 6 wherein a plurality of said test structures are exposed to a plurality of magnitudes of said radiation and changes in said density of electrical charge is determined for each magnitude of radiation.

12. The test structure of claim 6 wherein the radiation is produced by a member of a set of integrated circuit processing procedures that include ion implantation and plasma etching, and the magnitude of said radiation is a factor of the parameters of said integrated circuits processing procedures.

13. The test structure of claim 12 wherein modifying said parameters of said integrated circuit processing procedures and exposing a plurality of said test structures to the radiation so modified will create a profile of said parameters versus the amount of damage to said test structure and the density of electrical charge.

14. The test structure of claim 6 wherein the threshold voltage parameter is inversely proportional to a value of said charge collection capacitor connected in parallel with a series connection of a capacitance of the gate and a capacitance of the floating gate.

15. The test structure of claim 6 wherein the threshold voltage parameter is directly proportional to a charge collected on the floating gate of said stacked gate field effect transistor.

16. A method to profile the effects of radiation by the measurement of a density of an electrical charge per unit area induced to a semiconductor substrate by said radiation having a magnitude comprising the steps of:
   a) fabricating a plurality of stacked gate field effect transistors each having a drain, a source, a floating gate to accumulate and retain said electrical charge, and a gate;
   b) fabricating a plurality of charge collection capacitors wherein each charge collection capacitor is connected to the gate of one of said plurality of stacked gate field effect transistors and wherein each charge collection capacitor has an area that is unequal to the area of any of the other charge collection capacitors of the plurality of charge collection capacitors;
   c) exposing said plurality of stacked gate field effect transistors and the plurality of charge collection capacitors to the radiation;
   d) contacting each stacked gate field effect transistor with a threshold voltage measuring apparatus;
   e) measuring and recording a threshold voltage parameter for each of the stacked gate field effect transistors;
   f) comparing said threshold voltage parameter of each stacked gate field effect transistor with the area of each charge collection capacitor attached to said stacked gate field effect transistor;
   g) determining a change in the threshold voltage parameter between each of the plurality of stacked gate field effect transistors versus the change in area for each of the charge collection capacitors attached to the stacked gate field effect transistors, which is the density of said electrical charge induced per unit area of exposure to said radiation;
   h) examining said semiconductor substrate to identify any damage to said semiconductor substrate as a result of said electrical charge;
   i) modifying said magnitude of radiation; and
   j) repeating said method to measure said density of said electrical charge to establish a profile of said modifying of fabrication parameters versus amount of damage to said semiconductor substrate as a result of said electrical charge induced by said radiation.

17. The method of claim 16 wherein the radiation is produced by a member of a set of integrated circuit processing procedures that include ion implantation and plasma etching, and the magnitude of said radiation is a factor of the parameters of said integrated circuits processing procedures.

18. The method of claim 16 wherein the threshold voltage parameter is inversely proportional to a value of said charge collection capacitor connected in parallel with a series connection of a capacitance of the gate and a capacitance of the floating gate.

19. The method of claim 16 wherein the threshold voltage parameter is directly proportional to a charge collected on the floating gate of said stacked gate field effect transistor.

* * * * *